(12) United States Patent
Hakamada

(10) Patent No.: US 6,908,562 B2
(45) Date of Patent: Jun. 21, 2005

(54) METHOD OF FORMING ELECTRODE FOR SAW DEVICE

(75) Inventor: Shinichi Hakamada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 156 days.

(21) Appl. No.: 10/351,554

(22) Filed: Jan. 27, 2003

(65) Prior Publication Data

US 2003/0173332 A1 Sep. 18, 2003

(30) Foreign Application Priority Data

Mar. 18, 2002 (JP) ........................................ 2002-075025

(51) Int. Cl.[7] .................... B29D 11/00; B44C 1/22
(52) U.S. Cl. ..................... 216/24; 216/32; 216/67; 216/77; 438/712; 204/192.35
(58) Field of Search ................. 216/24, 32, 67, 216/77; 438/712; 204/192.35

(56) References Cited

U.S. PATENT DOCUMENTS

| 4,294,672 A | * 10/1981 | Ohba et al. .................. 205/646 |
| 4,615,908 A | * 10/1986 | Behn et al. .................... 427/81 |
| 5,106,471 A | * 4/1992 | Galvin et al. ........... 204/192.35 |
| 6,204,190 B1 | * 3/2001 | Koshido ..................... 438/712 |
| 6,526,996 B1 | * 3/2003 | Chang et al. ................. 134/1.3 |

* cited by examiner

*Primary Examiner*—Shamim Ahmed
(74) *Attorney, Agent, or Firm*—Takeuchi & Takeuchi

(57) ABSTRACT

A method of forming an electrode for a surface acoustic wave (SAW) device comprises the steps of forming an alloy film (32) made of aluminum (Al) and magnesium (Mg) on a substrate (31) and selectively etching the alloy film (32) by using a gaseous mixture composed of $BCl_3$, $Cl_2$, and $N_2$ to form the electrode such that the electrode has at least one sidewall polymer film (33). The method controls the production of hillocks and voids to provide high withstand voltage.

9 Claims, 5 Drawing Sheets

Micro-wave power (mA)

METHOD OF FORMING ELECTRODE FOR SAW DEVICE

BACKGROUND OF THE INVENTION

1. Field of the Invention

The present invention relates to a method of forming an electrode for a surface acoustic wave (SAW) device and, especially, to an inter digital transducer (IDT) electrode and a method of forming the same.

2. Description of the Related Art

FIG. 5 shows a conventional IDT of an SAW device. An IDT pattern is made by forming a conductive film 2 with Aluminum (Al) on a piezoelectric substrate 1 made of $LiTaO_3$ and etching the film 2 with a photoresist mask.

However, when the Al film is used for the IDT, there has been a problem that the withstand voltage per unit area is not sufficient due to the migration.

It has been proposed that a small amount of another metal is added to Al or a layered structure shown in FIG. 6 is employed to increase the withstand voltage. However, as the demands for a small or high-frequency SAW device increases, it is more difficult to obtain the satisfactory withstand voltage because the line width and thickness of the electrode must be made smaller and smaller to satisfy the high-frequency use.

FIG. 6 shows a conventional IDT having three-layered structure. First, second, and third conductive films 3, 4, and 5 are formed on the substrate 1 in this order. Then, the conductive films 3, 4, and 5 are dry-etched to form an IDT with a photoresist pattern.

One cause of the deterioration in the withstand voltage result from the problem of film structure besides the problem of pattern design. When a film is made of Al, voids and hillocks are produced by a stress in the film when high electric power is applied to the film, thus causing the deterioration. That is, the strain produced by the SAW causes the stress in the electrode films and when the stress exceeds the critical limit, the Al atoms move in the grain boundary, thus producing the voids inside the electrode or the hillocks in the surface of the electrode. Especially, when the hillocks are produced along the sidewall of the IDT pattern, adjacent electrodes are broken by short-circuit. In the SAW device in FIG. 6, the hillocks can not be prevented from being produced along the sidewalls of the electrode.

In the above dry-etching, when the electrode includes, besides Al, a metal whose halogenide has a high vapor pressure, such as Ti, Pd, and Si, the etching is completely performed without any residue. On the other hand, when the electrode includes a metal whose halogenide has a low vapor pressure, such as Mg, the halogenide remains as residue, thus causing corrosion. Especially, if such a metal is included with high concentration, the etching itself does not proceed. If over-etching is attempted to solve the incomplete etching, the substrate is also etched and adverse influences on the characteristics of the SAW device are produced.

In dry-etching for an Al alloy, $Cl_2$ gas is used for increasing the etching rate of the Al alloy and also $BCl_3$ gas having deoxidation property is added for removing a natural oxide film. $Cl_2$ gas containing a halogen becomes a component of a protective film on the sidewalls to prevent side etching. However, when the electrode includes, besides Al, a metal whose halogenide has a low vapor pressure, the etching is finished with residue or the etching itself does not proceed. That is, even if chlorine radical is attached to the electrode, the etching does not proceed because the Al alloy has high activation energy unlike pure Al.

SUMMARY OF THE INVENTION

Accordingly, it is an object of the present invention to provide a method of forming an electrode for a SAW device, wherein the electrode has high withstand voltage by controlling voids and hillocks, and etching an Al alloy film is performed without residue even if the Al alloy includes, besides Al, a metal whose halogenide has a low vapor pressure.

According to the present invention, there is provided a method for forming an electrode for the SAW device, which comprises the steps of forming an alloy film with Al and Mg on a substrate and forming an electrode by selectively etching the alloy film such that the electrode has sidewall film.

DESCRIPTION OF THE PREFERRED EMBODIMENTS (First Embodiment)

Figure 1:
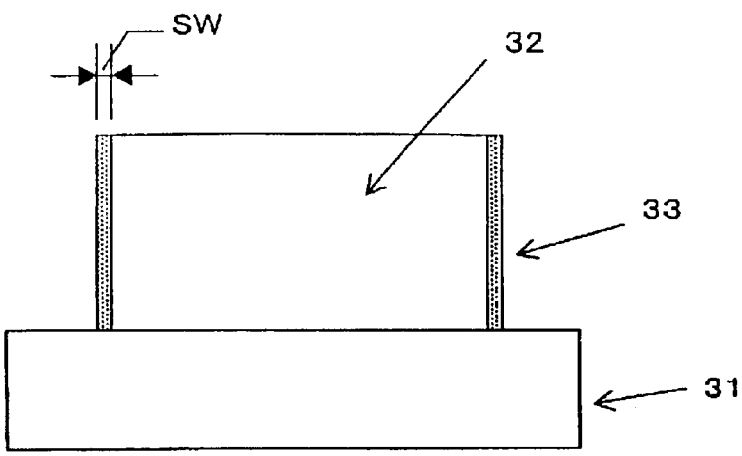
FIG. 1 is a sectional view of an IDT according to the first embodiment of the invention.

In FIG. 1, a first metallic film 32 is formed on a piezoelectric substrate 31 made of $LiTaO_3$, etc. by a magnetron spattering method. The first metallic film 32 is made of Al to which 3.5% by weight of Mg is added.

Then, a resist film is formed on the first metallic film 32 and a resist pattern is formed by photolithography. An IDT is formed by anisotropic dry-etching using an electron cyclotron resonance (ECR) etching apparatus (micro-wave etching apparatus).

Figure 7:
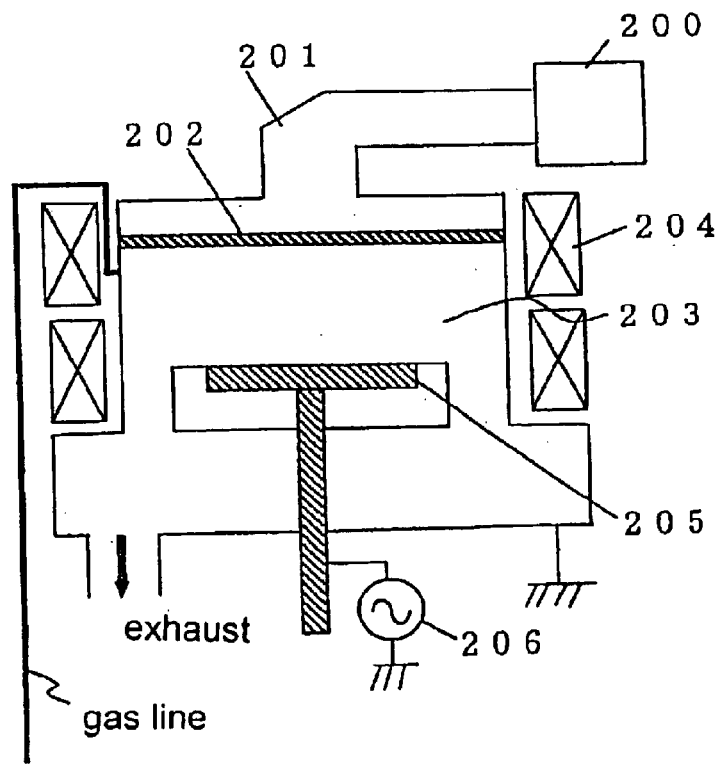
FIG. 7 is a schematic diagram showing a conventional ECR etching apparatus.

In a conventional ECR etching apparatus shown in FIG. 7, $\mu$-wave produced by a magnetron 200 travels to an etching chamber 203 through a wave-guide tube 201 and a guiding window 202, and causes electron cyclotron resonance with an electromagnetic field produced by an electromagnetic field control coil 204, thus generating a high-density plasma. An RF bias is independently applied to a sample holder 205 from a high-frequency electric source 206 connected with the sample holder 205. A halogen gas, such as $BCl_3/Cl_2$, is used for dry-etching for Al. A Cl radical is a main etching species and promotes a spontaneous and quick etching reaction. However, the Cl radical alone performs an isotropic etching. Accordingly, a certain amount of incident ion energy is usually applied (RF bias is applied in case of the ECR etching apparatus) to activate an ion assist mechanism for providing highly anisotropic etching.

However, when the electrode includes a metal whose halogenide has a low vapor pressure, such as Mg, there is the problem that etching is finished with residue or etching itself does not proceed.

Various experiments show that the addition of small amount of $N_2$ to $BCl_3/Cl_2$ is effective to produce no residue. The detailed etching reaction upon the addition of $N_2$ has not been explicated but it has been confirmed that the dissociation of halogen molecules is accelerated by the addition of $N_2$, thus increasing the etching speed by 10 to 30%. For the etching, $BCl_3$, (boron chloride) gas of 30 sccm, $Cl_2$ (chlorine) gas of 70 sccm, and $N_2$ gas of 10 sccm are used as reaction gases with treatment pressure of 8 mTorr, microwave power of 300 mA, and RF power of 30 W. Then, the unnecessary resist is removed by ashing using a gaseous mixture of $O_2/CHF_3$ in an ashing treatment chamber of the apparatus, cleaning with pure water is effected for approximately one minute, and baking at 100° C. on a hot plate is effected for one minute.

When the etching is performed under the above conditions, a thick sidewall polymer film 33 is formed on each of the sidewalls of the first metallic film 32. The sidewall polymer film 33 is a polymerized film including Al, Mg, C, O, B, N, and Cl. Experiments show that the sidewall polymer film 33 controls the production of side hillocks and increases the withstand voltage.

The width of the sidewall polymer film 33 varies with the etching conditions and the amount of added Mg. When a pattern has a width of approximately 1.2 $\mu$m and the first metallic film 32 has a thickness of 4,000 Å under the above etching conditions, the width of the sidewall polymer film 33 is approximately 0.03 $\mu$m, and no corrosion of the metallic electrode is observed even after exposure to air for 72 hours, thus providing high corrosion resistance. That is, the sidewall polymer film 33 formed on the sidewall of the first metallic film 32 prevents hillocks from being produced in the first metallic film 32.

In the first embodiment, Mg of 3.5 weight % is added to Al for the first metallic film 32, however, experiments show that when one or more percent by weight of Mg is added, the sidewall polymer film is formed and the withstand voltage is increased. However, if 15 or more percent by weight of Mg is added, etching can not be performed under the above conditions.

The relationship between various parameters and the width of the sidewall polymer film 33 will be described with respect to FIG. 4. The width SW of the sidewall polymer film 33 in FIG. 1 is defined as a thickness in a direction perpendicular to the sidewall of the first metallic film 32.

Graphs 4 (a), (b), (c), (d), and (e) of FIG. 4 show the widths SW of the sidewall polymer film according to the present invention versus (a) the amount of Mg, (b) the pressure (mTorr), (c) the Rf power, (d) the throughput of $N_2$ gas, and (e) the micro-wave power, respectively.

(1) The relationship between the amount (weight %) of added Mg and the width SW of the sidewall polymer film is shown in Table 1.

TABLE I

| Amount of Mg (weight %) | SW ($\mu$m) |
| --- | --- |
| 0 | 0.008 |
| 1 | 0.012 |
| 2 | 0.020 |
| 4 | 0.030 |
| 5 | 0.042 |
| 8 | 0.083 |
| 10 | 0.123 |
| 13 | 0.268 |

TABLE I-continued

| Amount of Mg (weight %) | SW ($\mu$m) |
| --- | --- |
| 15 | Excessive film remains (measurement not available) |

Figure 4A:
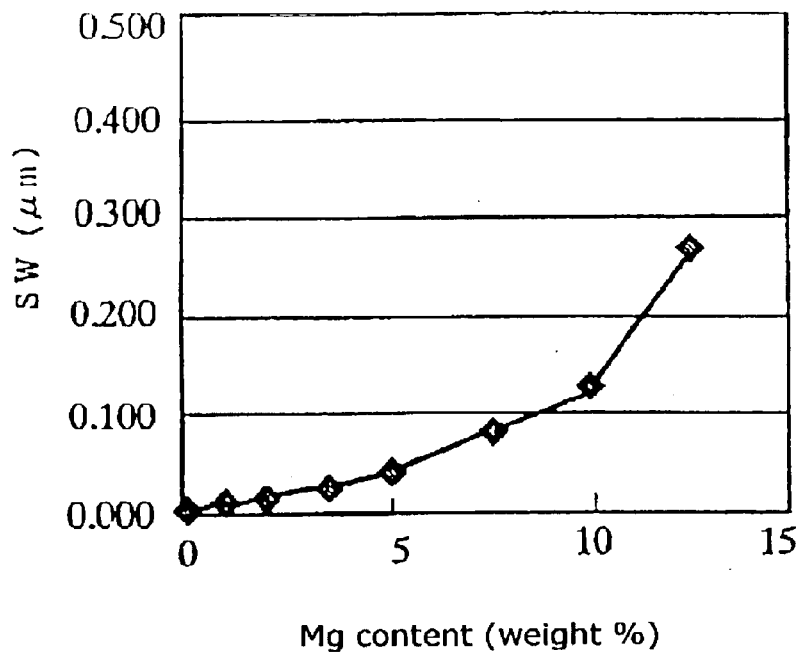
FIGS. 4(a)–4(e) are graphs showing various characteristics of a polymer film formed on a sidewall of an IDT electrode according to the present invention.

As shown in table 1 and FIG. 4(a), when the amount of Mg is in the range of 1–10 weight %, a designated sidewall polymer film is formed without any excessive remaining film. However, when the amount is more than 10 weight %, especially more than 15 weight %, the etching is not completely performed so that an excessive polymer film remain and the sidewall polymer film cannot be measured. Accordingly, it is desirable that the amount of Mg is in the range of 1–10 weight %.

(2) The relationship between the pressure (mTorr) and the width SW of the sidewall polymer film is shown in Table 2.

TABLE 2

| Pressure (mTorr) | SW ($\mu$m) |
| --- | --- |
| 5 | 0.032 |
| 8 | 0.030 |
| 12 | 0.026 |
| 16 | 0.038 |
| 20 | 0.033 |

Figure 4B:
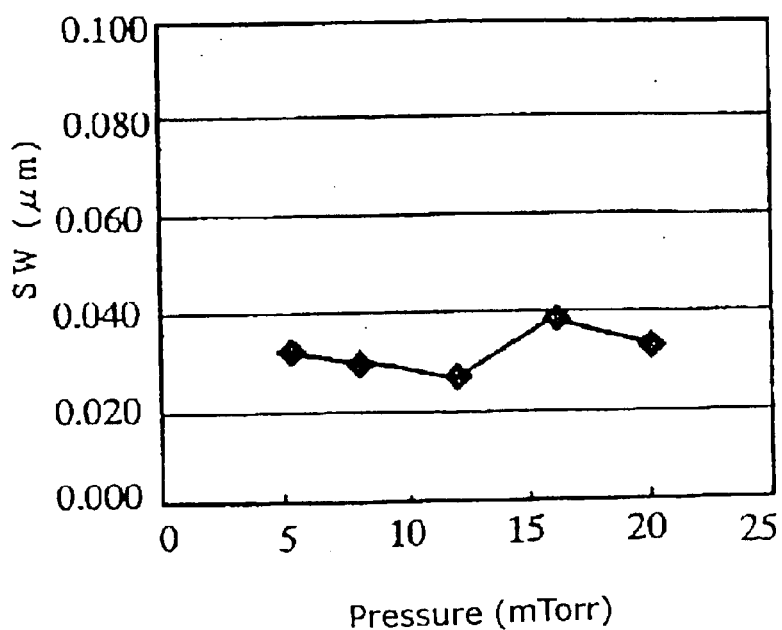

As shown table 2 and FIG. 4(b), the width SW does not vary significantly in the working pressure range of 5–20 mTorr.

(3) The relationship between the Rf power and the wall polymer film is shown in Table 3.

TABLE 3

| Rf power (W) | SW ($\mu$m) |
| --- | --- |
| 25 | 0.028 |
| 30 | 0.030 |
| 40 | 0.037 |
| 50 | 0.046 |
| 60 | 0.042 |

Figure 4C:
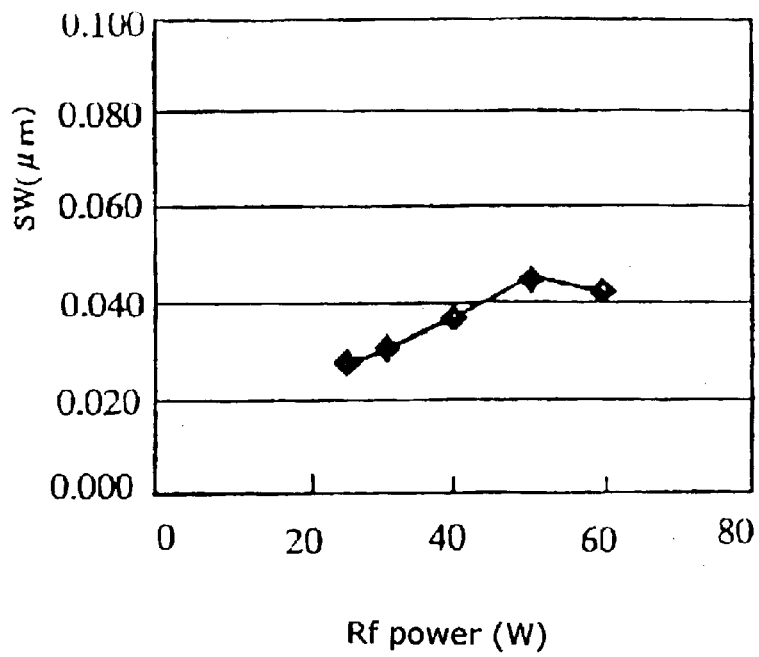

As shown in table 3 and FIG. 4(c), the width SW increase as the Rf power increases; however, it remains uncharged when the Rf power is more than 50 W.

(4) The relationship between the throughput of $N_2$ gas and the width SW of the sidewall polymer film is shown in Table 4.

TABLE 4

| throughput of $N_2$ gas (sccm) | SW ($\mu$m) |
| --- | --- |
| 0 | residue stays |
| 5 | 0.057 |
| 10 | 0.030 |
| 15 | 0.152 |
| 20 | excessive film remains (measurement not available) |

Figure 4D:
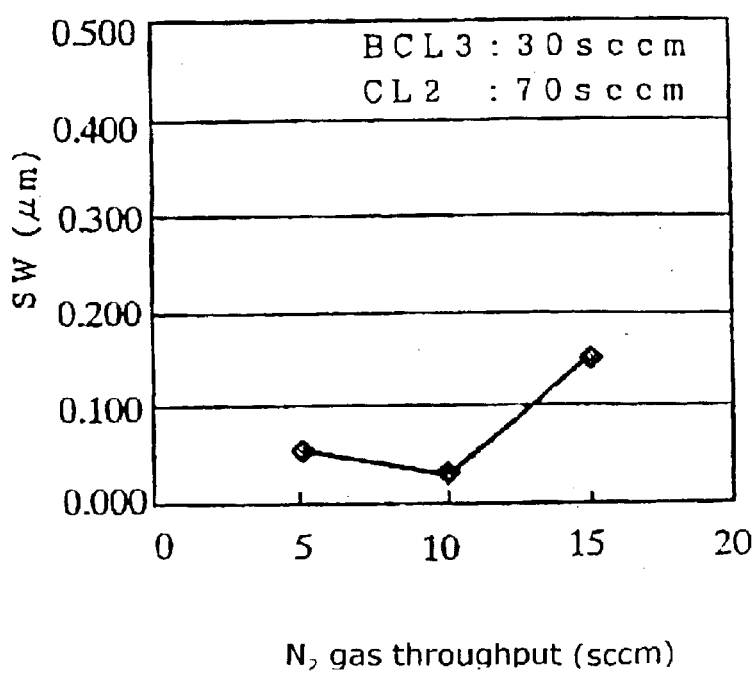

As shown in table 4 and FIG. 4(d), when the throughput of $N_2$ gas is more than 20 sccm, an excessive film remains, resulting in etching failure. When the throughput is in the range of 5–15 sccm, the etching is properly performed under the conditions of $BCl_3$ of 30 sccm and $Cl_2$ of 70 sccm. The unit "sccm" of throughput is one standard cc/min. at one atmospheric pressure (1,013 hPa) and 25° C. constant temperature.

(5) The relationship between the micro-wave power and the width SW of the sidewall polymer film is shown in Table 5.

TABLE 5

| Micro-wave power (mA) | SW ($\mu$m) |
|---|---|
| 200 | 0.032 |
| 300 | 0.030 |
| 400 | 0.028 |

Figure 4E:
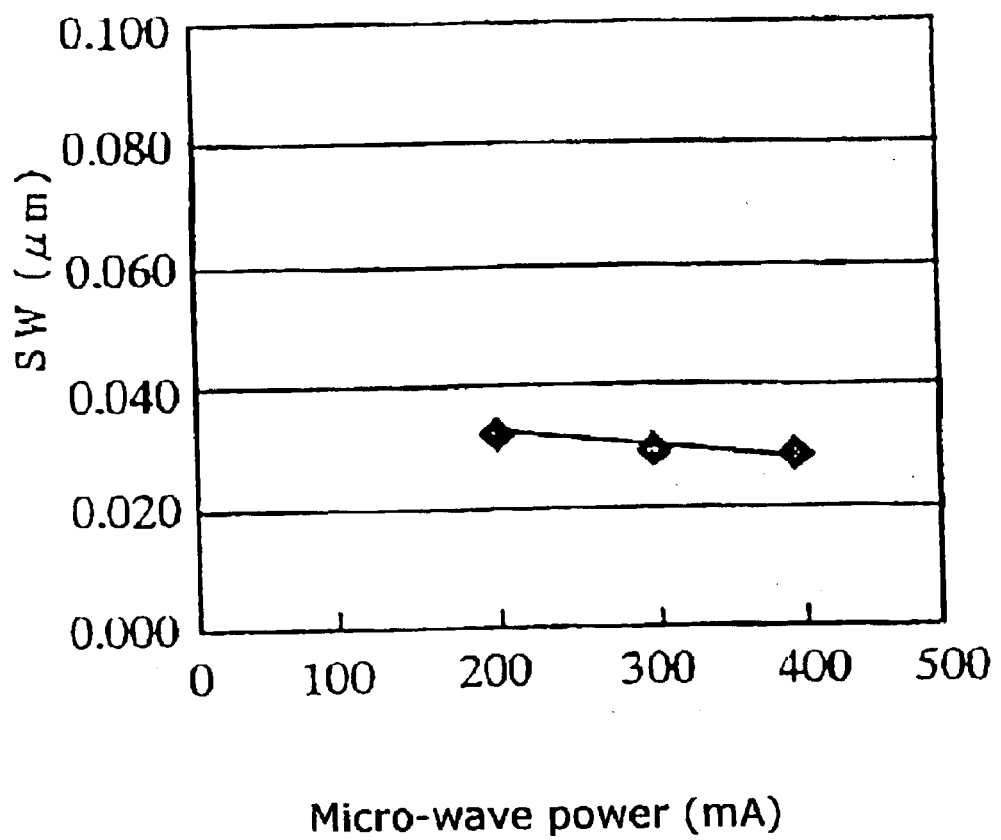

As shown in table 5 and FIG. 4(e), no significant change of the width SW is recognized in the range 200–400 mA.

As described above, according to the first embodiment, the sidewall polymer film 33 formed on the sidewall of the first metallic film 32 prevents the production of hillocks in the first metallic film 32 and, therefore, the withstand voltage is significantly increases.

Figure 5:
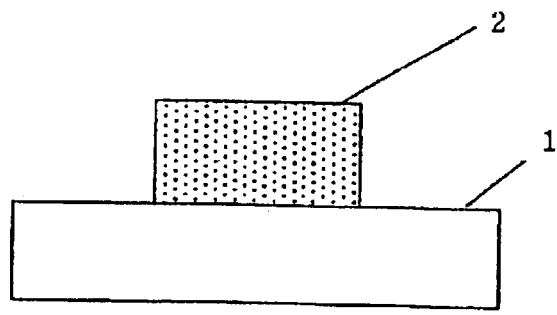
FIG. 5 is a sectional view of a conventional IDT of an SAW device.
Figure 6:
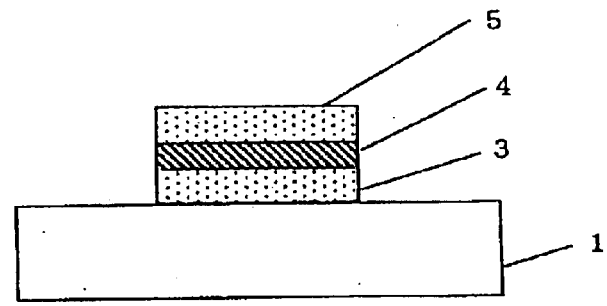
FIG. 6 is a sectional view of a conventional IDT having a three-layered structure for an SAW device.

More specifically, the life expectancy of the electrode for the withstand voltage according to the first embodiment is more than 1,000 times that of the conventional electrode having the conductive film 2 shown in FIG. 5, which is made of Al with Cu of 0.5 weight % and has a thickness of 4,200 Å, and more than 14 times that of the conventional electrode having the three-layered conductive film shown in FIG. 6, which consists of the first conductive film 3 made of Cr (150 Å), the second conductive film 4 made of Al with Cu of 0.5 weight % (3,800 Å), and the third conductive film 5 made of Cr (150 Å).

(Second Embodiment)

Various characteristics of an IDT according to the second embodiment are similar to those of the first embodiment shown in Tables 1–5.

Figure 2:
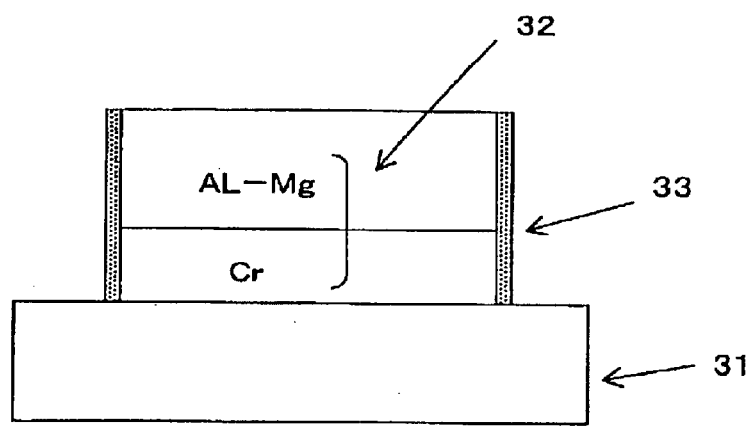
FIG. 2 is a sectional view of an IDT according to the second embodiment of the invention.

In FIG. 2, a first metallic film 32 is formed on a piezoelectric substrate 31 by the magnetron spattering. The first metallic film 32 has two layers composed of a Cr film having a thickness of 100 Å and an Al film containing Mg of 3.5 weight % and having a thickness of approximately 4,000 Å formed on the substrate 31 in this order. A resist film is formed on the first metallic film 32 and a resist pattern is formed by photolithography. An IDT is formed by anisotropic dry-etching using an electron cyclotron resonance (ECR) etching apparatus.

Then, unnecessary resist is removed by ashing in an ashing treatment chamber of the apparatus using a gaseous mixture of $O_2$/$CHF_3$, cleaning with pure water is provided for approximately one minute, and baking at 100° C. on a hot plate is provided for one minute.

For the first etching for etching the Al—Mg film, $BCl_3$ (boron chloride) gas of 30 sccm, $Cl_2$ (chlorine) gas of 70 sccm, and $N_2$ gas of 10 sccm are used as a reaction gas with treatment pressure of 8 mTorr, micro-wave power of 300 mA, and RF power of 30 W. For the second etching for etching the Cr film, $Cl_2$ gas of 90 sccm and $O_2$ gas of 10 sccm are used as a reaction gas with treatment pressure of 8 mTorr, micro-wave power of 300 mA, and RF power of 0 W.

When the etchings are performed under the above conditions, a thick sidewall polymer film 33 is formed on each of the sidewalls of the first metallic film 32.

The width SW of the sidewall polymer film 33 varies with the etching conditions and the amount of added Mg. When a pattern having a width of approximately 1.2 $\mu$m and the first metallic film 32 having a thickness of 4,000 Å is formed under the above etching conditions, the width SW of the sidewall polymer film 33 is approximately 0.03 $\mu$m, and no corrosion of the metallic electrode is observed even after exposure to the air for 72 hours, thus providing high corrosion resistance.

Since the Cr film, which has a slow etching speed or approximately 5% of the etching speed of the Al film, is formed as the lowermost layer, the first etching is stopped before reaching the substrate so that the substrate is not damaged. Also, in the second etching, the lowermost Cr film minimizes the damage to the substrate because the second etching is p without the application of Rf power to make the incident ion energy small. The second etching for the lowermost Cr film may be performed by wet-etching using cerium ammonium nitrate to minimize the damage applied on the substrate 31.

As described above, according to the second embodiment, the sidewall polymer film 33 formed on the sidewall of the first metallic film 32 prevents the hillocks from being made in the first metallic film 32 and the withstand voltage is significantly increased.

Also, since the Cr film is formed as the lowermost film of the first metallic film 32, the damage to the substrate by the etching is minimized and the adhesion between the substrate and the first metallic film is increased by the Cr film.

(Third Embodiment)

Various characteristics of an IDT made according to the third embodiment are similar to those of the first embodiment shown in Tables 1–5.

Figure 3:
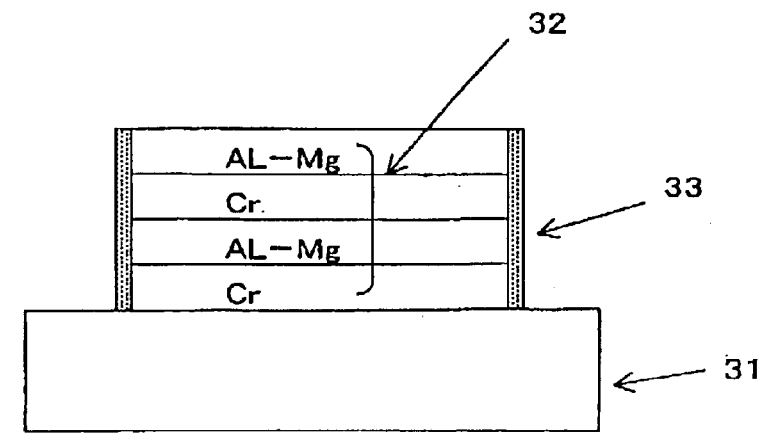
FIG. 3 is a sectional view of an IDT according to the third embodiment of the invention.

In FIG. 3, s first metallic film 32 is formed on a piezoelectric substrate 31 by the magnetron spattering. The first metallic film 32 has four layers composed of a Cr film of 100 Å thickness, an Al film containing 3.5 weight % of Mg and having a thickness of 1,800 Å, another Cr film of 35 Å thickness, and another Al film containing 3.5 weight % of Mg and having thickness of 1,800 Å, formed on the substrate 31 in this order. A resist film is formed on the first metallic film 32 and a resist pattern is formed by photolithography. An IDT is formed by anisotropic dry-etching using an ECR etching apparatus.

Then, unnecessary resist is removed by ashing in an ashing treatment chamber of the apparatus using a gaseous mixture gas of $O_2$/$CHF_3$, cleaning with pure water is provided for approximately one minute, and baking at 100° C. on a hot plate is provided for one minute The first etching collectively etches the three upper films including the Al—Mg, Cr, and Al—Mg films, and the second etching etches the lowermost Cr film. For the first etching, $BCl_3$ gas of 30 sccm, $Cl_2$ gas of 70 sccm, and $N_2$ gas of 10 sccm are used as a reaction gas with treatment pressure of 8 mTorr, micro-wave power of 300 mA, and RF power of 30 W. For the second etching, $Cl_2$ gas of 90 sccm and $O_2$ gas of 10 sccm are used as a reaction gas with treatment pressure of 8 mTorr, micro-wave power of 300 mA, and RF power of 0 W.

When the etchings are performed under the above conditions, a thick sidewall polymer film 33 is formed on each of the sidewall of the first metallic film 32. The width SW of the sidewall polymer film 33 varies with the etching conditions and the amount of added Mg. When a pattern having a width of approximately 1.2 $\mu$m is formed under the above etching conditions, the width SW of the sidewall polymer film 33 is approximately 0.03 $\mu$m.

Unnecessary resist is then removed in an ashing treatment chamber of the apparatus, cleaning with pure water is provided for approximately one minute, and baking at 100° C. on a hot plate is provided for one minute.

When the etching is performed on the above etching conditions, no corrosion of the metallic electrode is observed even after exposure to air for 72 hours, thus providing high corrosion resistance.

Since the Cr film, which has a slow etching speed or approximately 5% of the etching speed of the Al film, is formed as the lowermost layer, the first etching is stopped before reaching the substrate so that the substrate is not damaged. Also, in the second etching, the lowermost Cr film minimizes the damage to the substrate because the second etching is performed without Rf power. The second etching may be performed by wet-etching using a cerium ammonium nitrate.

Since the thin Cr film is formed between the two Al—Mg film, the movement of Al atom is controlled by the alloy film so that the production of hillocks is reduced.

As described above, according to the third embodiment, the sidewall polymer film 33 formed on the sidewall of the first metallic film 32 prevents the side hillocks from being produced in the first metallic film 32 and the withstand voltage is significantly increased.

Also, since the Cr film is formed as the lowermost film of the first metallic film 32, the damage to the substrate made by etching is minimized and the adhesion between the substrate and the first metallic film is improved through the Cr film.

In addition, Since the thin Cr film is sandwiched between the two Al—Mg films, the movement of Al atoms is controlled so that the production of hillocks is reduced, thus further increasing the withstand voltage.

According to the present invention, the production of hillocks and voids is controlled and the withstand voltage is significantly increased by a method of forming an electrode for a surface acoustic wave (SAW) device which comprises the steps of forming an alloy film made of aluminum (Al) and magnesium (Mg) on a substrate and etching the alloy film selectively to form the electrode such that the electrode has sidewall films.

The etching may be performed with a gaseous mixture gas composed of $BCl_3$, $Cl_2$, and $N_2$.

The alloy film may contain Mg of 1–10 weight percent.

A Cr film may be formed on the substrate before forming the alloy film so that the alloy film is formed on the Cr film. Accordingly, the substrate is not damaged by the etching and adhesion between the substrate and alloy film is improved.

The Cr film may be selectively etched by using the alloy film as a mask. Accordingly, the substrate is not damaged by the etching and adhesion between the substrate and alloy film is improved.

The Cr and alloy films may be alternately formed a plurality of times.

The etching may be performed by applying high-frequency voltage.

A content of Mg in the alloy film may be changed so that the electrode has a different shape.

The $N_2$ gas contained in the mixed gas may have a throughput of 5–10 sccm.

What is claimed is:

1. A method of forming an SAW electrode for a surface acoustic wave (SAW) device, comprising the steps of:

providing a substrate;

selecting, as a material of said SAW electrode, an alloy made of aluminum (Al) and magnesium (Mg) to form an alloy film on said substrate; and selectively etching said alloy film to form said SAW electrode such that said SAW electrode has at least one sidewall film.

2. The method according to claim 1, wherein said etching is performed with a gaseous mixture composed of Bl3, Cl2, and N2.

3. The method according to claim 1, wherein said alloy film contains 1–10 weight percent of Mg.

4. The method according to claim 1, which further comprises the step of forming a film of chromium (Cr) on said substrate before the step of forming said alloy film so that said alloy film is formed on said Cr film.

5. The method according to claim 4, wherein said Cr film is selectively etched by using said alloy film as a mask.

6. The method according to claim 4, wherein said Cr and alloy films are alternately formed a plurality of times.

7. The method according to claim 1, wherein said etching is performed by applying a high-frequency voltage.

8. The method according to claim 1, wherein a content of Mg in said alloy film is changed so that said electrode has a different shape.

9. The method according to claim 2, wherein said $N_2$ gas contained in said gaseous mixture has a throughput of 5–10 sccm.

* * * * *